(12) United States Patent
Cheung

(10) Patent No.: US 8,495,335 B2
(45) Date of Patent: Jul. 23, 2013

(54) DATA TRANSLATION SYSTEM AND METHOD

(75) Inventor: Frank N. G. Cheung, Agoura, CA (US)

(73) Assignee: Raytheon Company, Waltham, MA (US)

( * ) Notice: Subject to any disclaimer, the term of this patent is extended or adjusted under 35 U.S.C. 154(b) by 1746 days.

(21) Appl. No.: 11/454,689

(22) Filed: Jun. 16, 2006

(65) Prior Publication Data

US 2007/0290903 A1    Dec. 20, 2007

(51) Int. Cl.
*G06F 9/26* (2006.01)

(52) U.S. Cl.
USPC .......................................................... 711/202

(58) Field of Classification Search
USPC .......................................................... 711/202
See application file for complete search history.

(56) References Cited

U.S. PATENT DOCUMENTS

| | | | |
|---|---|---|---|
| 5,734,892 A * | 3/1998 | Chu ...................................... | 1/1 |
| 6,236,678 B1 * | 5/2001 | Horton et al. .................. | 375/222 |
| 6,317,063 B1 | 11/2001 | Matsubara | |
| 6,320,594 B1 * | 11/2001 | Young ........................... | 345/605 |
| 6,549,519 B1 * | 4/2003 | Michels et al. .............. | 370/238 |
| 2002/0097208 A1 | 7/2002 | Hashimoto | |
| 2004/0139090 A1 * | 7/2004 | Yeh ............................... | 707/100 |
| 2004/0151398 A1 * | 8/2004 | Betrisey et al. ............... | 382/260 |
| 2005/0289626 A1 * | 12/2005 | Aboulgasem et al. ........ | 725/106 |
| 2007/0261021 A1 * | 11/2007 | Aberg ........................... | 717/105 |
| 2008/0041047 A1 * | 2/2008 | Kato ............................... | 60/431 |

FOREIGN PATENT DOCUMENTS

| | | |
|---|---|---|
| EP | 0 980 146 A2 | 2/2000 |
| EP | 1 569 458 A1 | 8/2005 |
| JP | 05 167447 | 7/1993 |

OTHER PUBLICATIONS

Rao R K et al, "Optimized DSP Implementation of Non-Linear Quantization", Preprints of papers presented at the AES Convention, May 12, 2001, vol. 110, No. 5363, pp. 1-6 Relevant to p. 2, left hand document; Claim 1.
Gray R M et al, "Quantization", IEEE Transaction on Information Theory, IEEE Service Center, Piscataway, NJ, US, vol. 44, No. 6, Oct 1, 1998, pp. 2325-2383.

* cited by examiner

*Primary Examiner* — Hoai V Ho
*Assistant Examiner* — Min Huang
(74) *Attorney, Agent, or Firm* — Pierce Atwood LLP; Joseph M. Maraia

(57) ABSTRACT

A data translation system and method. This invention provides a reverse approach to implement a M bit input to N bit output cumulative/monotonic transfer function (where M>N) by a (2N)×M bit memory instead of the conventional (2M)×N bit memory. The invention offers substantial circuit size savings without compromising on transfer function resolution and is independent of transfer function mapping algorithms. The M bit memory content of the reverse LUT contains input video group information for each output level and the (2**N) addresses of the reverse LUT represent the corresponding transfer function output levels. This data to address representation of the input to output relationship is exactly opposite to the conventional address to data format. Search and compare methods are employed to locate the input video group that the incoming video belongs to and the associated address of the reverse LUT represents the output.

23 Claims, 11 Drawing Sheets

| ADDRESS | DATA |
|---|---|
| 0 | 0 |
|  |  |
| A | Oi |
| B | Oi |
| C | Oi |
| * | * |
| * | * |
| * | * |
| K | Os |
| L | Os |
| M | Os |
| N | Os |
| * | * |
| * | * |
| * | * |
| * | * |
| T | Ox |
| U | Ox |
| V | Ox |
| W | Ox |
| X | Ox |
| Y | Ox |
| * | * |
| 2M | 2N |

CONVENTIAL LUT MAPPING

FIG. 4a
(BACKGROUND ART)

| ADDRESS | DATA |
|---|---|
| 0 | * |
| * | * |
| Oi | C |
| Oi+1 | * |
| * | * |
| Os | N |
| * | * |
| Ox | Y |
| * | * |
| 2N | 2M |

REVERSE MAPPING

FIG. 4b

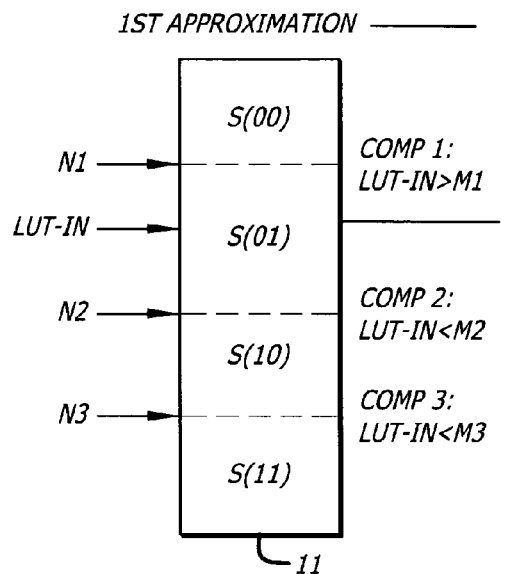
FIG. 6a
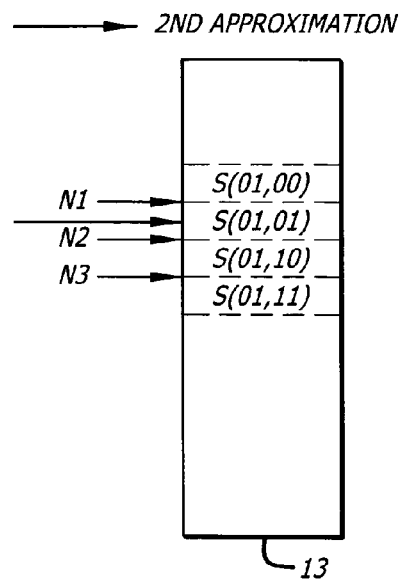
FIG. 6b
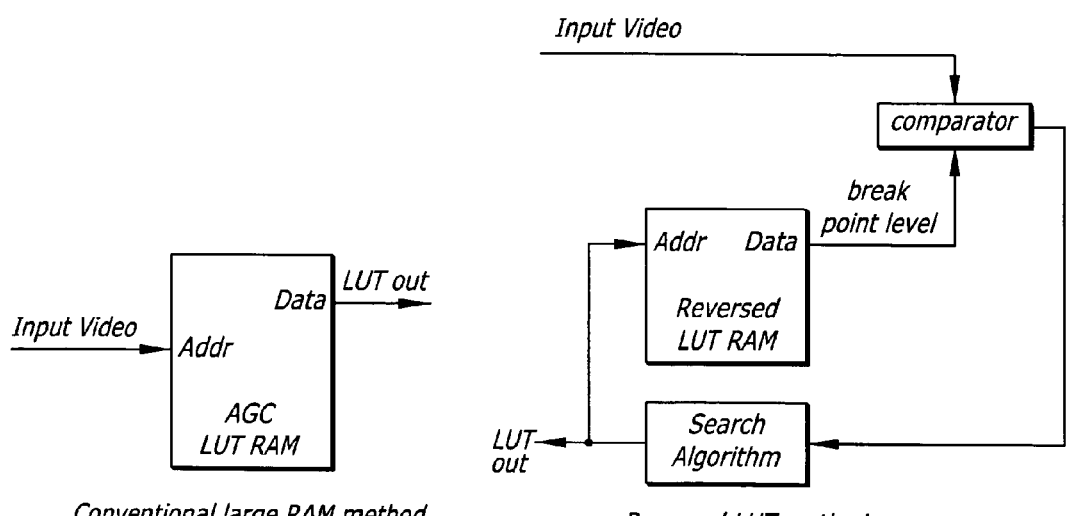
FIG. 10a (BACKGROUND ART)
FIG. 10b

DATA TRANSLATION SYSTEM AND METHOD

BACKGROUND OF THE INVENTION

1. Field of the Invention

The present invention relates to electrical and electronic circuits and systems. More specifically, the present invention relates to systems and methods for compressing data.

2. Description of the Related Art

Video compression is widely used in digital systems to map information rich digital video to the limited dynamic, range of conventional displays. A typical requirement is to map a 12-bit digital video signal to a display with an eight bit dynamic range. Conventionally, an input video range is divided into sections by break points. Each input section is mapped to an output display level. During the mapping transformation, some ranges of the input digital video signal may be preserved or compressed, depending on the algorithm and application. Thus, the transform may be a linear or a non-linear mapping process.

In accordance with one approach, video compression is implemented via a RAM based look up table (LUT). In accordance with this approach, the digital video data is used to address the LUT and the output thereof is range compressed display video. However, as the number of input video bits grows, the size of the LUT memory grows exponentially, as well as the effort required to update the LUT. For example, if a 12-bit input video signal is compressed into 8-bit output range, the LUT would take up $(2^{12} \times 8) = 32768$-bits. For a 14 bit to 8-bit LUT, the size of memory is 4 times greater. For high-speed video systems, interfacing to external memory becomes a bottleneck and it is problematic to update the LUT. In any event, this method enables one to match any complex transfer function curve.

An alternative approach involves piecewise linear approximation. In accordance with this approach, several coarse break points are used over the input video range and linear interpolation is used between break points to map the input video to the output domain. The adjustment resolution on the shape of the input to output transfer curve relies on the number of break points used. Thus, the method cannot handle highly non-linear transfer curves resulting from complex algorithms without loss of resolution. Moreover, the method requires a high precision, fast multiplier that takes up space on a die and forces designers to use more expensive components.

Note that both methods described above use input video as an address to the LUT and the data content of the LUT contains the display video information.

Nonetheless, a need exists in the art for a system and method for data compression, particularly video data compression, that is compact in size and capable of handling complex, nonlinear compression transfer curve without compromising resolution.

SUMMARY OF THE INVENTION

The need in the art is addressed by the data translation system and method of the present invention. This invention provides a reverse approach to implement a M bit input to N bit output cumulative/monotonic transfer function (where M>N) by a $(2^{}N) \times M$ bit memory instead of the conventional $(2^{}M) \times N$ bit memory. In this context, a cumulative/monotonic transfer function is a function which all of its output changes, if any, are unidirectional (i.e. either ascending or descending) as input increases. The invention offers substantial circuit size savings without compromising on transfer function resolution and is independent of transfer function mapping algorithms. The M bit memory content of the reverse LUT contains input video group information for each output level and the $(2^{**}N)$ addresses of the reverse, LUT represent the corresponding transfer function output levels. This data to address representation of the input to output relationship is exactly opposite to the conventional address to data format. Search and compare methods are employed to locate the input video group that the incoming video belongs to and the associated address of the reverse LUT represents the output.

The invention is output resolution based. In the illustrative embodiment, the number of LUT locations is equal to the number of output video levels and the content of the LUT contains the break point information of the input video. The invention uses the maximum number of break points to map input video onto an output display domain and thus, allows for an optimal adjustment resolution and flexibility of input to output transfer curve fitting, independent of mapping algorithms. It does not use interpolation method between coarse break points and thus, does not employ multipliers. The LUT used by conventional methods have (address=input video, data=output video) type of configuration. The reverse LUT introduced in the present invention has (address=output video, data=input video break points) configuration. This LUT address/content arrangement is the reverse of the conventional methods. Backward searching, data-to-address type methods are applied rather than conventional forward-looking, address-to-data approach. Break points from the reverse LUT are algorithmically accessed and compared to the input video in search for the correct output level. The process uses break point data contained in the memory content to obtain the proper output level information represented by the address of the reverse LUT. This is the exact opposite of the conventional address to data flow.

For a 12-bit to 8-bit video compression application, the reverse LUT takes only $2^8 \times 12 = 3072$ memory bits rather than $2^{12} \times 8 = 32768$-bits by the conventional method, that is a 10× reduction. Another advantage provided by the present invention is that increase of video input bits only changes the size of LUT by a fraction rather than an exponential expansion. For example, for a 14 bit to 8-bit application, the reverse LUT takes only $2^8 \times 14 = 3584$ bits which is only a 17% increase in size comparing to the 12 to 8-bit implementation, while the conventional LUT would have a 4× jump in size.

Since the maximum number of break points is employed by the reverse LUT, the present invention provides the best possible transfer curve fit and drastic circuit size reduction. Moreover, as the number of input video bits grows, size of this reverse LUT grows only by a fraction instead of an exponential increase.

In the illustrative embodiment, the inventive system includes a memory for storing breakpoints of a desired input to output transfer function as a first set, of thresholds and a comparator for comparing an input signal to the first set of thresholds and providing a first output in response thereto indicative of a first range of the input signal.

In a specific implementation, a first address controller is included for selecting a second set of thresholds in response to the first output, the second set of thresholds being a plurality of values of the transfer function in a subrange within the first range. A second comparator is included for comparing the input signal to the second set of thresholds and providing a second output in response thereto indicative of a second range of the input signal.

A second address controller selects a third set of thresholds in response to the second output. The third set of thresholds is selected from a plurality of values of the transfer function in a subrange within the second range. A third comparator compares the input signal to the third set of thresholds and provides a third output in response thereto indicative of a third range of the input signal.

A third address controller selects a fourth set of thresholds in response to the third output. The fourth set of thresholds is selected from a plurality of values of the transfer function in a subrange within the third range. A fourth comparator compares the input signal to the fourth set of thresholds and provides a fourth output in response thereto indicative of a fourth range of the input signal.

Logic is included for combining the outputs to provide an output signal in response to the input signal in accordance with the transfer function.

BRIEF DESCRIPTION OF THE DRAWINGS

FIG. 4a shows conventional LUT mapping;

FIG. 4b shows reverse mapping in accordance with the present teachings

FIG. 6 is a diagram that illustrates a successive search process to find the output value from the reverse LUT.

FIG. 10a is a simplified diagram showing an arrangement for a lookup table in accordance with conventional teachings.

FIG. 10b is a simplified diagram showing an arrangement for compressing input video in accordance with an illustrative embodiment of the present teachings.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

As discussed briefly in the Background, video compression is widely used in digital systems to map the information rich input digital video to the dynamic range limited output displays. The input to output relationship is a general M bit input to N bit output cumulative/monotonic transfer function with M>N, as shown in FIG. 1.

Figure 1:
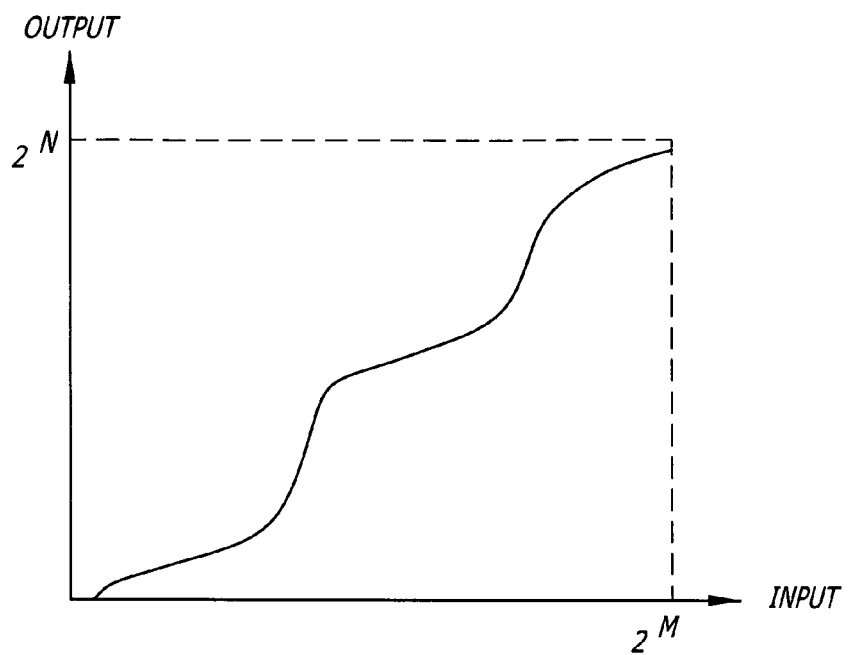
FIG. 1 is a graph of an illustrative M bit input to N bit output cumulative/monotonic transfer function with M>N.
Figure 2:
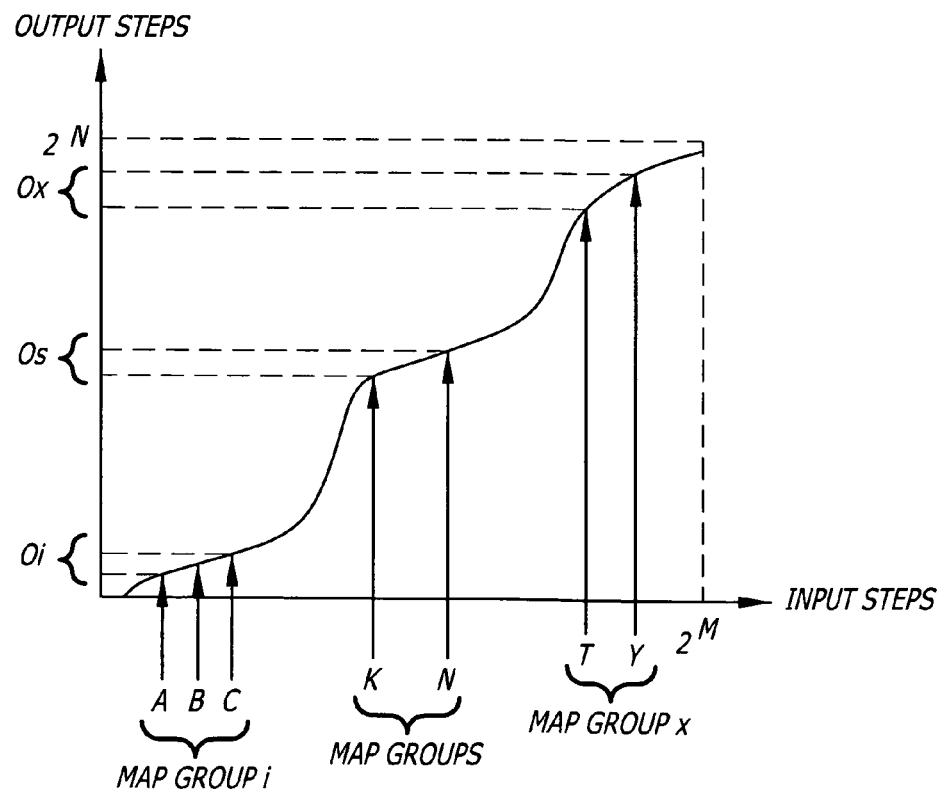
FIG. 2 shows the graph of FIG. 1 with an illustrative mapping transformation.

FIG. 2 shows the graph of FIG. 1 with an illustrative mapping transformation. The input video range is divided into sections by break points. Each input section is mapped to an output display level. During, the mapping transformation, some ranges of the input digital video may be preserved or compressed, depending on the algorithm and the application. Compressing M bit input to N bit output (where M>N) will cause multiple input steps to be mapped into an output step.

As shown in FIG. 2, input steps (A, B, C) map to the same output step $O_i$, (K thru N) map to output step $O_s$ and (T thru Y) map to output step $O_x$. A conventional way to implement such a linear/non-linear transfer function is to use a RAM based Look Up Table (LUT). The LUT is implemented by a $2^M \times 2^N$ memory. Input video is used to address the memory and the data content of the memory is used to provide the video display information.

However, as the number of input video bits grows, the size of the LUT memory grows exponentially; For example, for a 12-bit input video compressed into 8-bit output range application, the LUT would take up $(2^{12} \times 8)$=32768-bits. For a 14 bit to 8-bit LUT, the size of memory would be 4 times greater, i.e. $2^{14} \times 8$=131072-bits. For certain applications such as automatic gain control (AGC), the content of the LUT changes from time to time. With a large LUT in memory, interface to memory may become a bottleneck. The effort and time it takes to update the LUT is also significantly greater. This may lead to a need to interleave LUT's for certain high speed applications.

An alternative approach to implement the LUT is by piecewise linear approximation (PWL). This approach cuts down the memory usage but often compromises the integrity of the transfer function. In accordance with this approach, an input video range is divided into several coarse regions by coarse break points. A linear interpolation technique is applied between coarse break points to map the input video to an output domain, as shown by dotted lines in FIG. 3.

Figure 3:
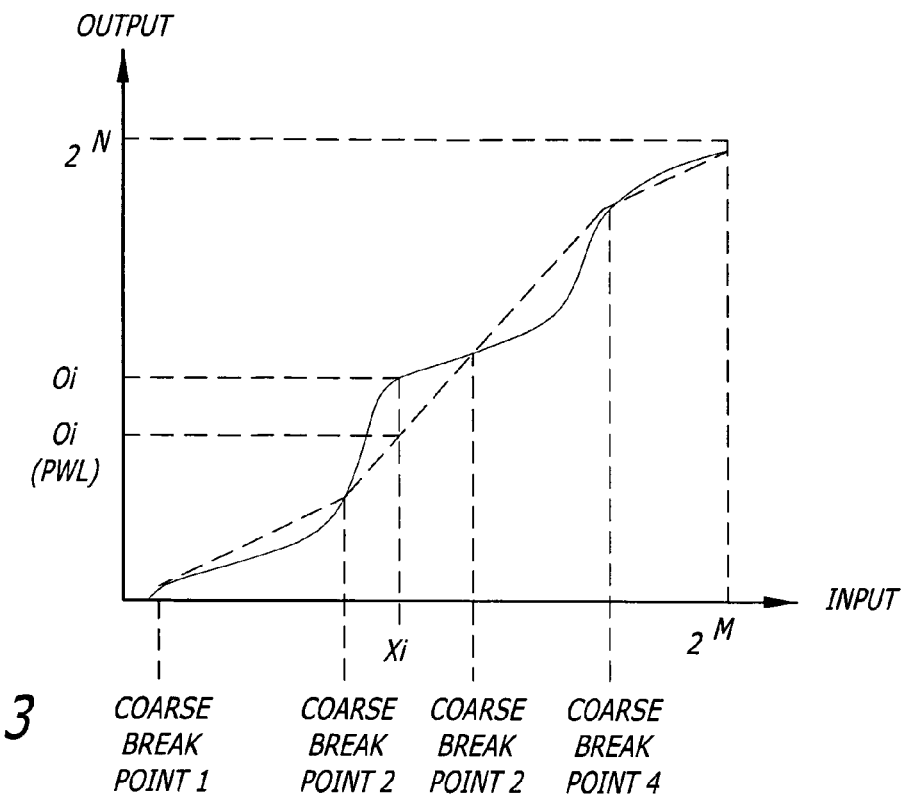
FIG. 3 shows the graph of FIG. 1 with an illustrative piecewise linear mapping, transformation.

FIG. 3 shows the graph of FIG. 1 with an illustrative piecewise linear mapping transformation. As illustrated by the deviation between transfer function output $O_i$ and the interpolation output. $O_i$(PWL) for an input $X_i$ in FIG. 3, the transfer curve shape fitting resolution relies on the number of coarse break points used. Thus, the PWL method cannot handle highly non-linear transfer curves that may result from complex algorithms. Moreover, the method requires a high precision, fast multiplier, which requires much circuitry or forces designers to use more expensive components.

The present invention provides an alternative approach to implement an M bit input to N bit output (where M>N) cumulative/monotonic Look Up Table (LUT). The inventive approach is a 'reverse' approach. For best possible transfer function curve fitting, the present invention uses a maximum number of break points for a given set of input/output sizes. This ensures that the invention will provide optimum transfer curve-fitting capability independent of algorithms used.

Theoretically, the maximum number of break points is equal to the maximum number of output levels. Since either a single input step or a multiple of input steps can map to an output step (see FIG. 2), an economical, compact representation of the transfer function is one that "records" these break points as a function of output level. In accordance with the present teachings, for each output level, input values that are above the previous break point and lower or equal to the current break point are mapped to the same output level. Implementing this output-break point table by a RAM, yields an (address=output video, data=input video break point) configuration. This is different and reversed from the conventional (address=input video, data=output video) arrangement.

FIGS. 4a and 4b illustrate both the conventional and the reverse mapping of the input/output relations shown on FIG. 2. FIG. 4a shows conventional LUT mapping where address of the LUT is equal to input video and data of LUT contains the output video. For example, each input A, B and C represents a LUT location and content of these locations are equal to $O_i$.

FIG. 4b shows reverse mapping in accordance with the present teachings. By way of example, since inputs A, B and C are all mapped to output $O_i$, 'C' represents the group. On a reverse mapping (FIG. 4b), since address=output level (which is $O_i$), the data=break point of the group is 'C'. Hence, data 'C' is provided at address $O_i$ on the reverse map.

One benefit of the present invention is that it dramatically cuts down memory requirements for a transfer function implementation and hence, makes it possible to implement the LUT inside Field Programmable Gate Arrays (FPGAs) or application specific integrated circuits (ASICs) rather than having to carry large off-chip memories. Another advantage provided by the present invention is that an increase of video input bits only changes the size of the reverse LUT by a fraction rather than an exponential expansion. This is illustrated in the following table and FIG. 5:

TABLE I

| M | N | Memory bits (Conventional) | Memory bits (Reverse mapping) | Memory Bits % reduction | Mem. Size % increase (conventional) | Mem. Size % increase (reverse) |
|---|---|---|---|---|---|---|
| 10 | 8 | 8192 | 2560 | 68.75% | Reference | Reference |
| 12 | 8 | 32768 | 3072 | 90.6% | 400% | 20% |
| 14 | 8 | 131072 | 3584 | 97.3% | 1600% | 40% |
| 16 | 8 | 524288 | 4096 | 99.2% | 6400% | 60% |

Figure 5:
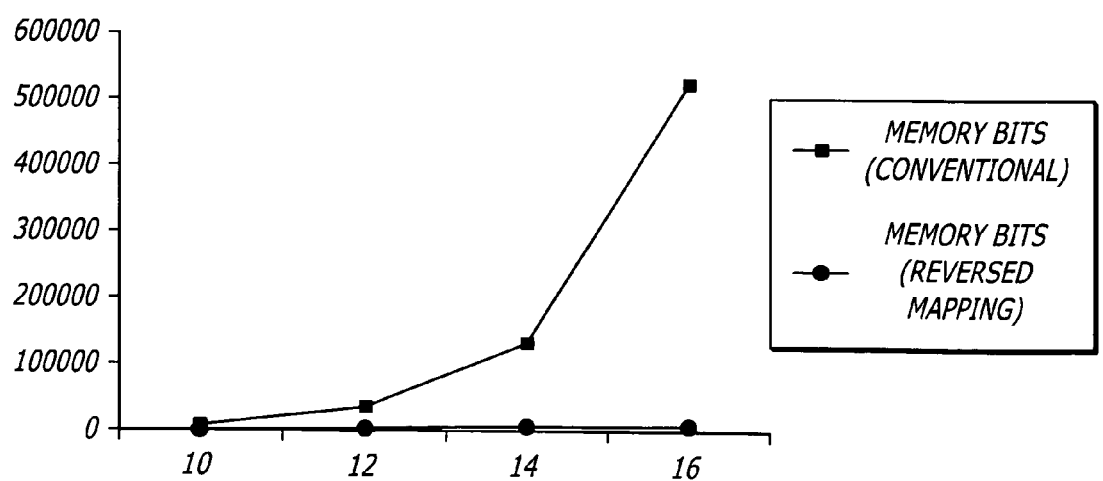
FIG. 5 is a diagram which shows a graph of memory required for a conventional LUT implementation and a graph of memory required for an LUT implementation in accordance with the reverse mapping approach of the present teachings.

FIG. 5 is a diagram which shows a graph of memory required for a conventional LUT implementation and a graph of memory required for an LUT implementation in accordance with the reverse mapping approach of the present teachings.

In accordance with the present teachings, backward searching, data-to-address type methods are applied to the reverse LUT to perform the input/output transfer function. Break points from the reverse LUT are algorithmically accessed and compared to the input video in search for the correct output level. The process uses break point data contained in the memory content to obtain the proper output level information represented by the address of the reverse LUT. This is the reverse of the conventional address to data flow.

FIG. 6 is a diagram that illustrates a successive search process to find the output value from the reverse LUT. In FIG. 6, memory search areas for the first and second successive search process are shown in FIGS. 6(a) and 6(b). Assume there are three address pointers (N1, N2, N3) and three threshold comparators for each successive search step. These three address pointers basically divide the reverse LUT into four sections. For the first approximation, these address pointers are set to ¼, ½ and ¾ of the full address range of the LUT (as shown in FIG. 6(a)). However, in practice, the break points may be set in any manner appropriate for a given application without departing from the scope of the present teachings.

Quarter-break points at the illustrated locations of the reverse LUT are fetched and compared with the input (LUT-in). Based on the results of the three comparators; it is possible to determine which quadrant the input resides and hence, the upper 2-bits of the LUT address. On the next approximation step, (N1, N2, N3) further slice the region (01xx) into four sections (as shown in FIG. 6(b)). In accordance with the present teachings, quarter-break points for the region (01xx) are fetched and compared with the input. The search process continues until all address bits are found. The final address of the reverse LUT represents the output value.

The present invention lends itself to plural implementation options, some of which are discussed more fully below without limitation.

Hybird Parallel—Pipeline

Figures 1, 7A:
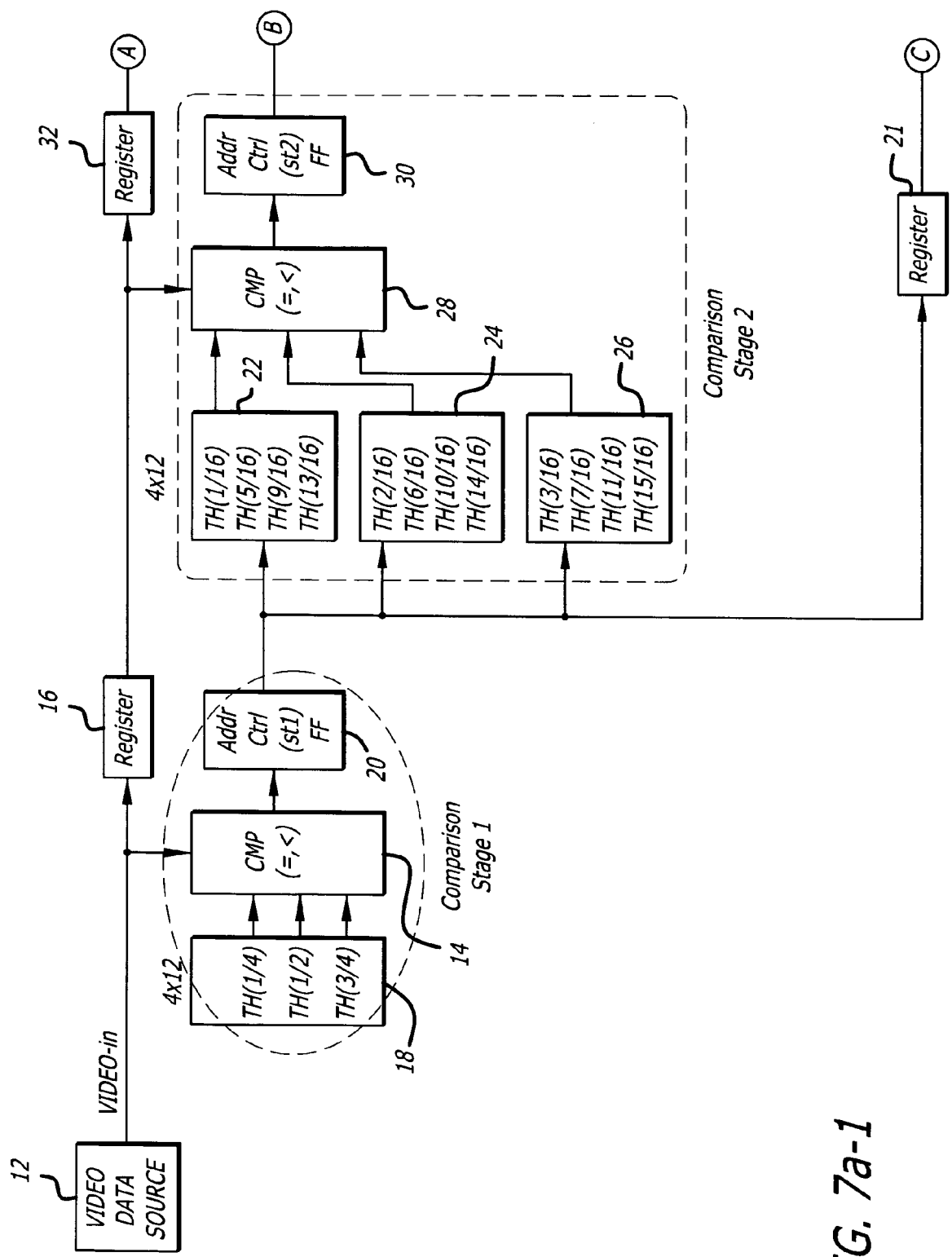
FIG. 7a is a block diagram of an illustrative hybrid parallel-pipeline implementation of a data translation system implemented in accordance with the present teachings.
Figures 2, 7A:
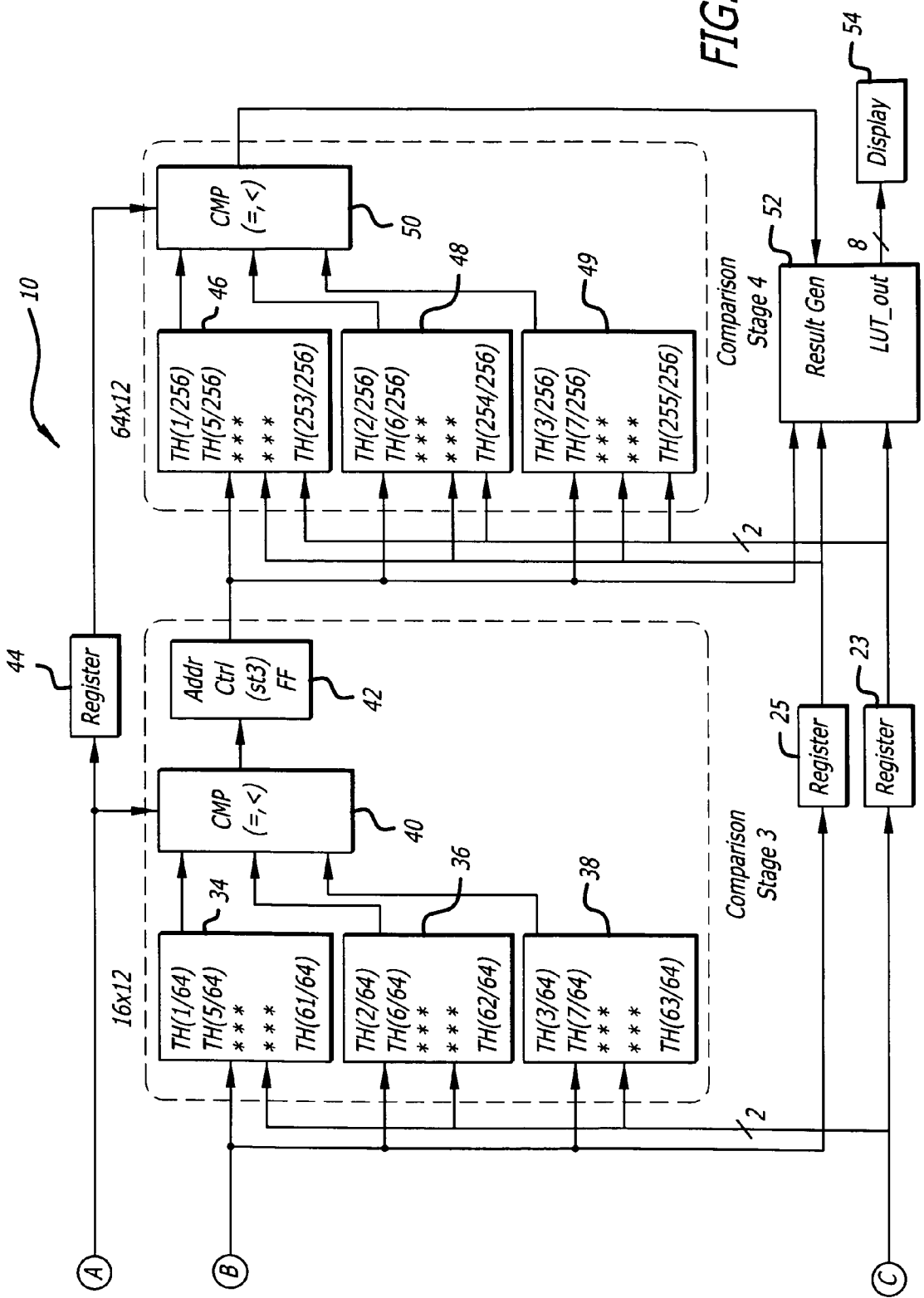

The hybrid approach has multiple pipeline stages, but more than one bit of the output is determined at some stages, as illustrated in FIG. 7a. In general, for an N bit output system, the pipeline has k stages, with $j_k$ bits determined at each stage and wherein the sum of all of the $j_k$'s would equal N. FIG. 7a is a block diagram of an illustrative implementation of a data translation system implemented in accordance with the present teachings. In FIG. 7a, a 12-bit to 8-bit data translation system 10 is shown. The system 10 is a four-stage system. An 8-bit output could be generated by eight 1-bit comparison stages, four 2-bit comparison stages, . . . , etc. The required memory: $2^8 \times 12 = 3072$-bits are distributed unevenly into 10 smaller memory blocks. The circuit basically uses 3 comparators in each comparison stage. With this 3-comparator architecture, it is possible to converge to ¼ of the range at each stage Hence, it will be possible to find an answer in 4 clock cycles. The circuit is fully pipelined so that it will not need to run at higher frequency.

The comparison stages are shown in FIG. 7a as 1, 2, 3 and 4 respectively. The system 10 is adapted to receive a digital video data input stream from a video data source 12. The input stream is input to a first comparator 14 and a register 16. The comparator 14 compares the input signal to a plurality of breakpoint thresholds stored in a first threshold memory 18. The comparator 14 determines the quadrant of the input signal and provides a first output with respect thereto to a first address controller 20. The address controller 20 then provides sub-range or sub-quadrant information to a second comparator 28 via a second set of threshold memories 22, 24 and 26 respectively.

As per the first stage, the second stage comparator 28 ascertains the subquadrant of the input signal supplied by the pipeline register 16 and provides a second output to a second address controller 30. The second address controller selects the next subrange from the a third set of threshold memories 34, 36 and 38. The third stage comparator 40 ascertains the subrange in which the input signal from a second pipeline register 32 lies and provides a third output to a third address controller 42.

The third address controller 42 uses this input to select an appropriate subrange from a fourth set of threshold memories 46, 48 and 49. A fourth comparator 50 compares the input signal from a pipeline register 44 to the subrange thresholds supplied by the fourth set of memories 46, 48 and 49. The time-aligned outputs of each of the address controllers and the fourth comparator 50 are fed to a result generator 52. The address controller output signals are time-aligned. For example, the first address controller output has to go thru two pipeline register stages 21 and 23 to time align it with comparator 50 output. The second address controller output has to go thru one pipeline register stage 25 to time align it with comparator 50 output. Third address controller output is time aligned with the output of the comparator 50.

In the illustrative embodiment, the result generator cascades these time-aligned results and forms the output. (See equation [1] below and associated text for an illustrative implementation of the result generator 52.) Those skilled in the art will appreciate that some of the threshold memories may be reused in applications where the ranges are symmetrical and uniform.

In operation, in stage 1, the three threshold values are data values obtained from addresses: 64, 128 and 192 (at ¼, ½ and ¾ of the address range) of the reverse LUT. Stage 2 takes in the 2-bit upper address found from stage 1 and brings out the correct threshold values at the desired ¹⁄₁₆ section. Notice that data are scrambled among the 3 memories so that the three threshold values associated with the selected quadrant are fetched at the same address input. At stage 3, two bit addresses from stage 2 and stage 1 are used to determine which of the ¹⁄₆₄ sections is needed. The final stage takes the two bit addresses from stages 1, 2 and 3 to select down to ¹⁄₂₅₆ of the output address. Then the result generator 52 analyzes the comparison results from different stages and forms the correct output.

The following example is illustrative of the operation of the present invention. Assume the input video=4 bits (16 shades of gray) and the display output (range limited)=2-bits (4 shades of gray). Next, assume a lineal input to output relationship. In this case, 4 input shades are mapped to one output shade. The input to output transfer function can be expressed using the following table:

TABLE II

| Input value | Output value |
|---|---|
| 0 | 0 |
| 1 | 0 |
| 2 | 0 |
| 3 | 0 |
| 4 | 1 |
| 5 | 1 |
| 6 | 1 |
| 7 | 1 |
| 8 | 2 |
| 9 | 2 |
| 10 | 2 |
| 11 | 2 |
| 12 | 3 |
| 13 | 3 |
| 14 | 3 |
| 15 | 3 |

The conventional LUT approach represents this transfer function using a 16×2 RAM (total number of RAM bits=32 ), with input value serving as the address to the RAM and data output of RAM representing the display output. The contents of the RAM are as shown in Table II.

The inventive (reverse LUT method) would represent the same transfer function in a 2×4 RAM (total RAM bits=8). The address of RAM represents the number of output shades and data of RAM contains the maximum input video value for each output shade. For example, input video values (4, 5, 6, 7) all map to output shade 1. Thus, the reverse LUT would have value 7 (max. video input value) at address 1 (output shade 1). The reverse LUT table is shown below:

TABLE III

| Address | Data |
|---|---|
| 0 | 3 |
| 1 | 7 |
| 2 | 11 |
| 3 | 15 |

When input video is received, the inventive search algorithm initiates operation. If a single comparator is used, a binary search algorithm is most appropriate. It first ascertains if the input video is smaller or equal to value in address 1 (half of the address range). If it is not, then the second comparison cycle determines if video is smaller or equal to 11 (¾ of the address range). If the input video is smaller than or equal to 11, the display output value is assigned to 2 (address value of reverse. LUT), otherwise, the display,output value is assigned to 3.

To accelerate the process, 3 comparators can be used to reduce the process to one step. Since the values need to be fed to the 3 comparators simultaneously in each step, it will be necessary to use registers instead of a RAM. The first comparator would have threshold value 3 (value at ¼ of reverse LUT address range), the next comparator would have threshold value 7 (value at ½ of reverse LUT address range), and the third comparator would have threshold value 11 (value at ¾ of reverse LUT address range).

Based on the outputs of these 3 comparators, it will be possible to ascertain where the output should be. Note: each comparator might provide a '1'if video is smaller than or equal to its threshold, '0'otherwise. Thus, if comparator (3, 2, 1) outputs=(1, 1, 1), the input video value must be less than or equal to 3, therefore, the display output should be zero. The logic relationships between the comparator outputs to display output are:

If comparator(3,2,1)=(1,1,1) then display output=0

Else if comparator(3,2,1)=(1,1,0) then display output=1 (video range=4 to 7)

Else if comparator(3,2,1)=(1,0,0) then display output=2 (video range=8 to 11)

Else display output=3 (video range must be 12 to 15)

Returning to FIG. 7*a*, each comparison stage has 3 comparators. Each comparator determines if the input video (video-in) is less than or equal to each assigned threshold. The comparators work exactly the same way as the example above, i.e., TH(¼) represents the value at ¼ of the reverse LUT table address range (as per the example above).

The 3 comparators in each comparison stage distinguish the input video a quarter closer to the display output than in the previous step. For example, stage 1 is accurate to ¼ of the output range, stage 2 is accurate to (¼)×(¼)=¹⁄₁₆, stage 3 is accurate to (¹⁄₁₆)×(¼)=¹⁄₆₄. For an 8-bit display output, 4 comparison stages are needed.

The output of each comparator is a 2-bit signal to be used by the follow-on comparison stages. This 2-bit signal represents which quarter the input video resides at each comparison stage. The signal is also pipelined into the result generator to form the final 8-bit result (each state is responsible for 2-bits).

The result generator 52 cascades the time-aligned 2-bit results from each comparison stage to form the output. In the illustrative embodiment, the output of stage 1 provides the most significant 2-bits of the result provided to the display 54, followed by the outputs of the successive stages. Thus, the output 8-bits (7:0)=(stage 1 msb, lsb), (stage 2 msb, lsb), (stage 3 msb, lsb), (stage 4 msb, lsb). To describe this in mathematical terms:

$$\begin{aligned}\text{output} = {} & 64 \times (\text{stage 1 output}) + \\ & 16 \times (\text{stage 2 output}) + \\ & 4 \times (\text{stage 3 output}) + \\ & (\text{stage 4 output})\end{aligned} \qquad [1]$$

In the, first stage (stage 1), the three; thresholds values (TH(¼), TH(½), TH(¾)) reside in registers as these values need to be accessed simultaneously. From stage 2 on, the three thresholds values come from the three individual RAM memories associated with each comparison stage. In the illustrative embodiment, the size of RAM increases by 4 times for each stage than the previous stage. The address to each RAM is the cumulative output from the previous comparison stages. For example, the stage 1 output distinguishes the input to ¼ output accuracy. Stage 2 further identifies the input to ¹⁄₁₆ accuracy. If video is in the lowest quarter, stage 1 output is "00". Then, stage 2 will need to compare input video to thresholds at (¹⁄₁₆, ²⁄₁₆ and ³⁄₁₆ of the reverse LUT address range). If stage 1 determines that the input video is more than the quarter threshold but less than or equal to half threshold, stage 2 should compare input video to thresholds at (⁵⁄₁₆, ⁶⁄₁₆ and ⁷⁄₁₆ of the reverse LUT address range) to locate the input video.

Each RAM in stage 2 must contain 4 values in respond to the stage 1 output. For stage 3, we need to distinguish input video to ¹⁄₆₄ accuracy. The size of RAM is increased to hold all possible comparison threshold values in ¹⁄₆₄ region. The outputs from stage 1 and stage 2 are needed to identify in which ¹⁄₁₆ subrange the input video resides and then use the stage 3 comparators to further locate input video down to 1 part in 64.

FIG. 7*a* shows an illustrative implementation, with processing clock running at data clock frequency.

Figure 7B:
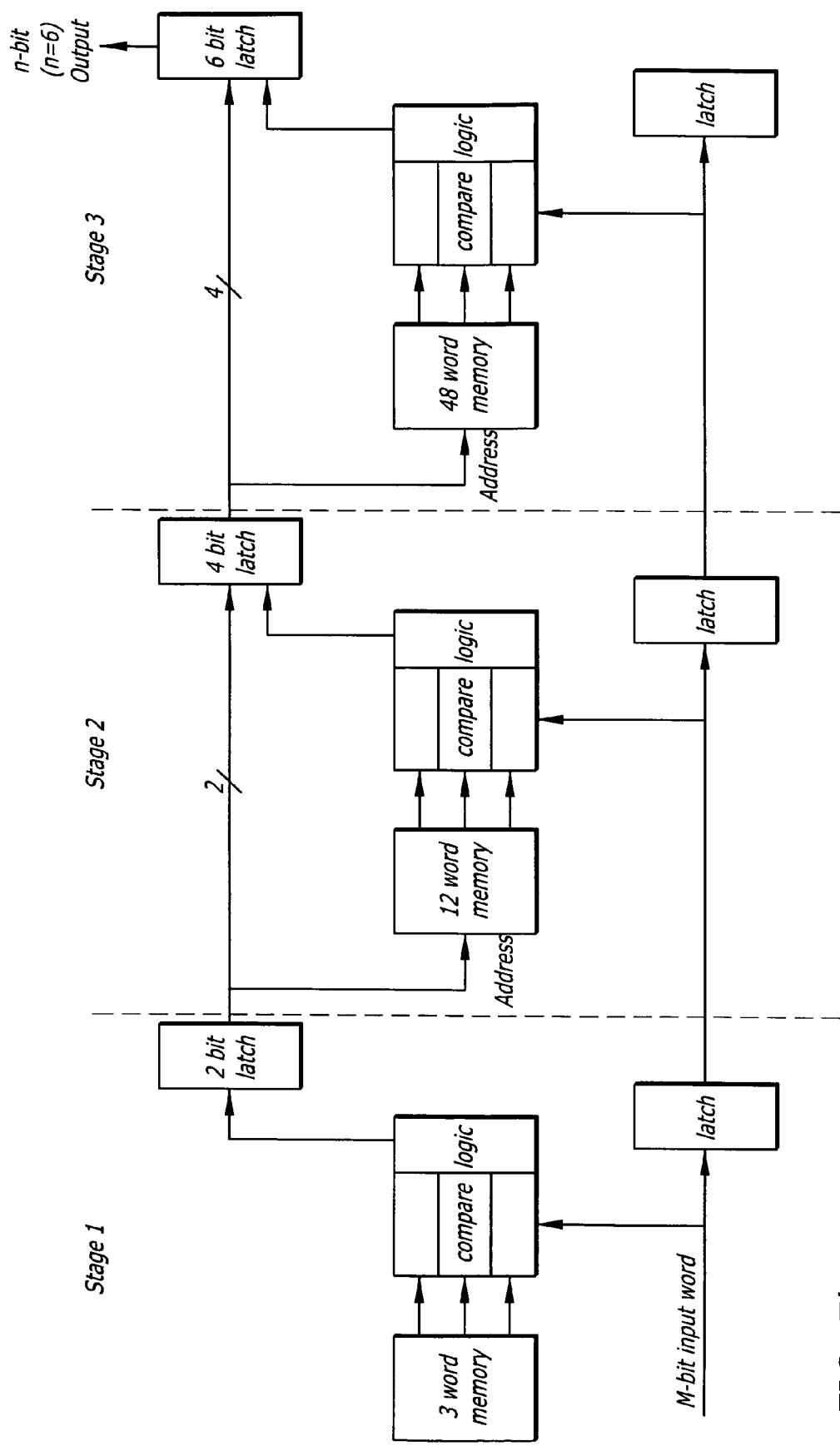
FIG. 7b is an implementation similar to that of FIG. 7a with some information on the generalized case of k stages of j bits.

FIG. 7*b* is an implementation similar to that of FIG. 7*a* with some information on the generalized case of k stages of j bits. Note that the first stage actually determines the 2 MSB of the output, and the $2^{nd}$ stage determines the next 2 significant bits, and so on. Note that every stage does not necessary have to compute the same number of bits—an eleven bit output would likely be five stages of two bits and one stage of one bit.

Those of ordinary skill in the art will appreciate that many other embodiments, methods, and approaches may be used to implement the inventive teachings without deviating from the scope of the present invention. One way is to use a much higher frequency processing clock, than the data clock. This would reduce hardware size because the same circuit could be reused at each search iteration. A binary search method is appropriate for implementation employing one comparator if the processing clock is at least 9 times faster than the data clock.

Parallel

Another implementation option involves the use of parallel comparators. That is, in the degenerate case, the input and $2^N-1$ breakpoints could be applied to $2^N-1$ comparators in parallel. The outputs of the comparators would be applied to simple logic that would determine the N-bit output. This approach might be similar to the approach used in 'flash'. A/D converters with the exception that the comparators in an A/D are typically analog.

Pipeline

Figure 7C:
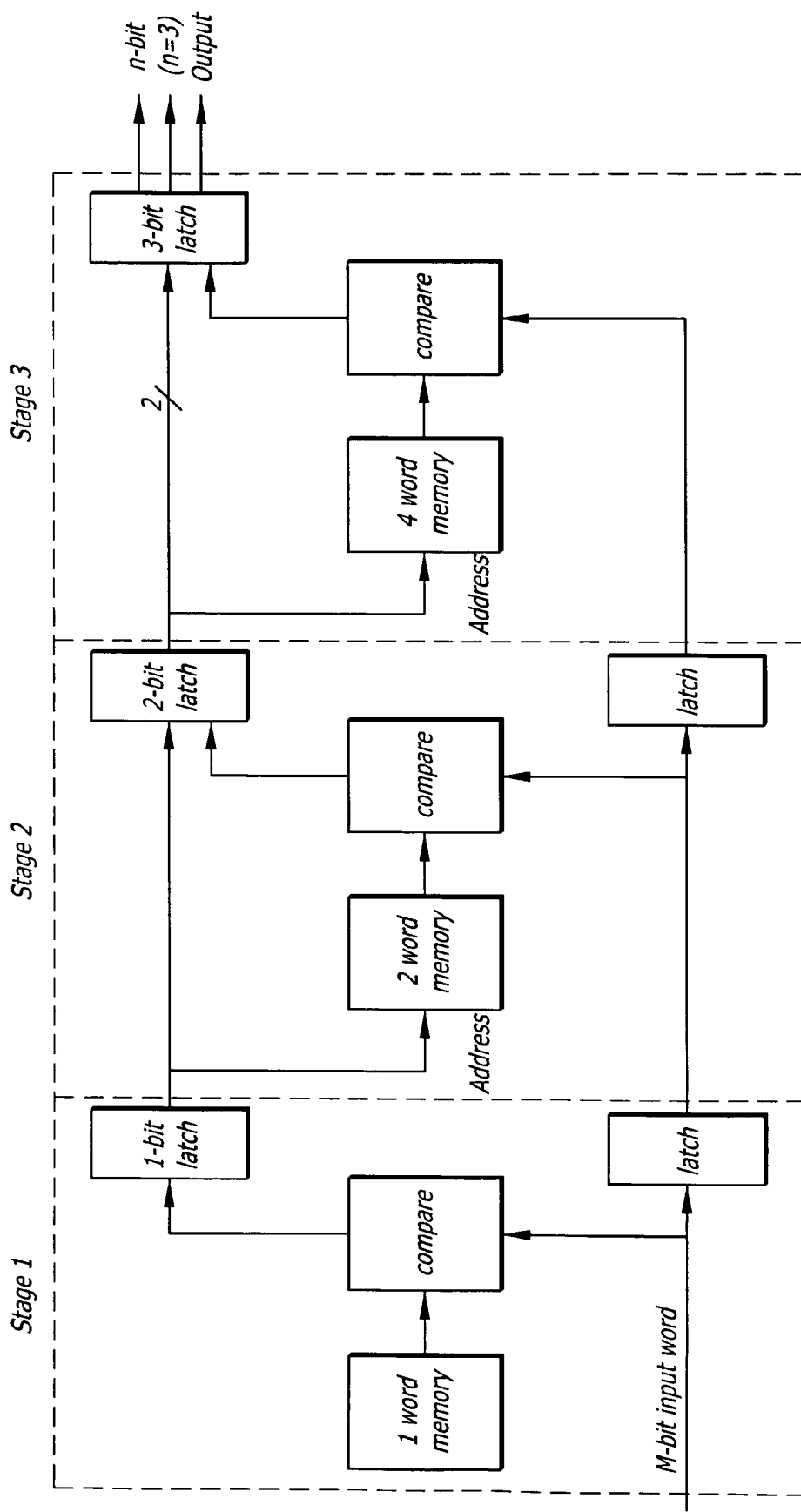
FIG. 7c is a block diagram of an alternative pipeline implementation of a data translation system implemented in accordance with the present teachings.

In this approach, for an N-bit output system, an N-stage pipeline is used as shown in FIG. 7*c*. FIG. 7*c* is a block diagram of an illustrative pipeline implementation of a data translation system implemented in accordance with the present teachings. In general, the pipeline has N stages, with one bit determined at each stage. FIG. 7*c* shows plural (e.g. three) stages arranged in cascade with n m-bit comparators, n−1 m-bit latches and $2^n-1$ words of memory. The first stage determines the most significant bit (MSB) of the output; the $2^{nd}$ stage determines the $2^{nd}$ MSB, and so on.

FIG. 7*c* illustrates a system for N=3, but this approach can be used for other values of N without departing from the scope of the present teachings.

Iterated

The iterated approach is basically a pipeline or hybrid approach where the stages are time-multiplexed through the same comparators and latch hardware. This approach is illustrated in FIG. 8 below.

Figure 8:
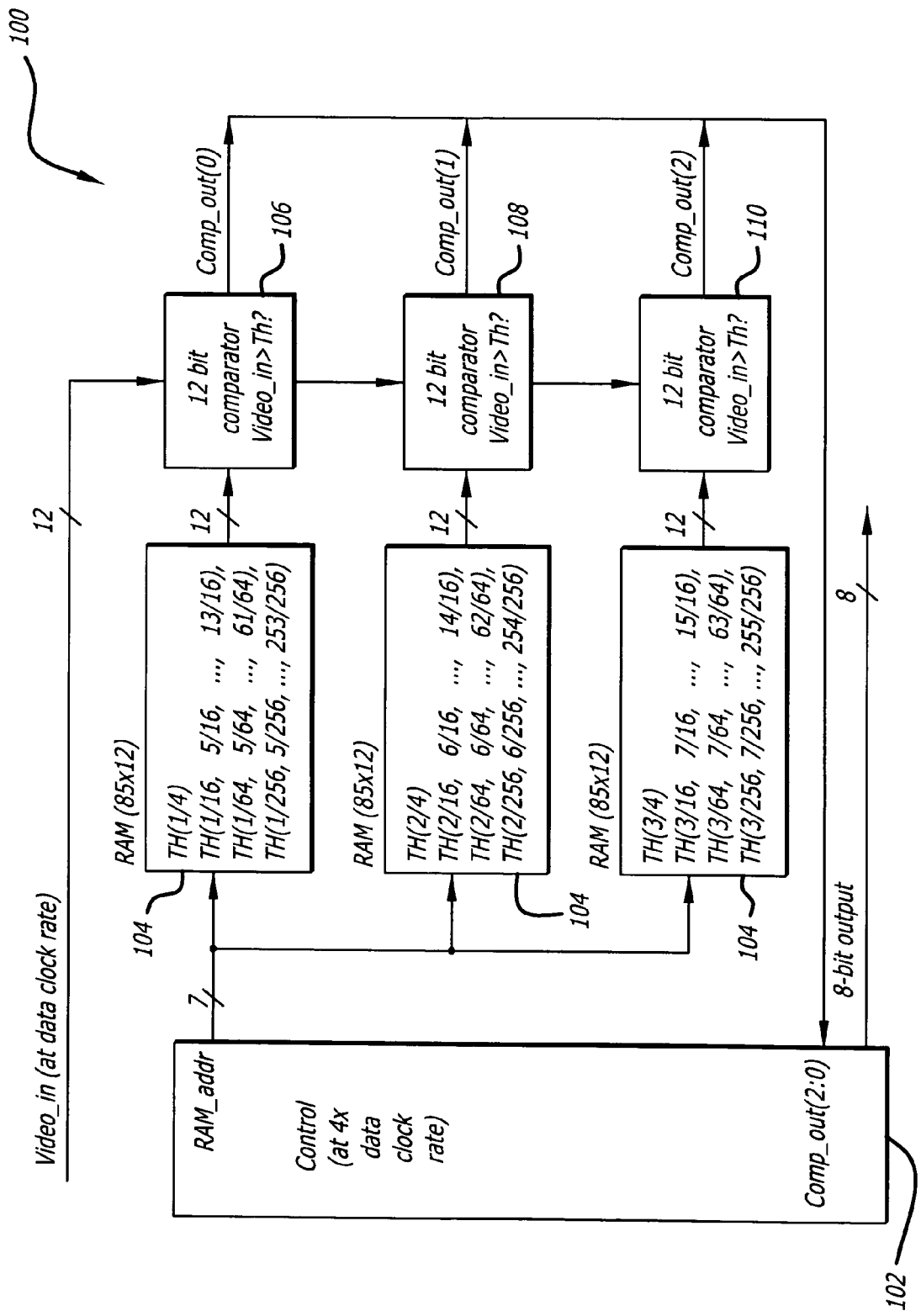
FIG. 8 is a block diagram of an alternative implementation of the data translation system of the present invention.

FIG. 8 is a block diagram of an alternative implementation of the data translation system of the present invention. In the system 100 of FIG. 8, a microprocessor or digital signal processor (DSP) 102 is used as a controlling device to realize the 3-comparator architecture at each comparison stage of FIG. 7*a*. In the illustrative embodiment, the controller 102 runs at 4 times the pixel clock rate and supplies the addresses to a RAM memory array 104. The memory array 104 supplies comparison threshold values to first, second and third comparators 106, 108 and 110. In the best mode, the memory array is implemented with random access memory (RAM). The outputs of the comparators are fed back to the controller 102. The controller then changes the addresses as necessary to continue the process described herein. The output is then provided by the controller as shown.

A hybrid-hybrid approach comprising a pipeline of several iterating stages is also possible.

Figure 9A:
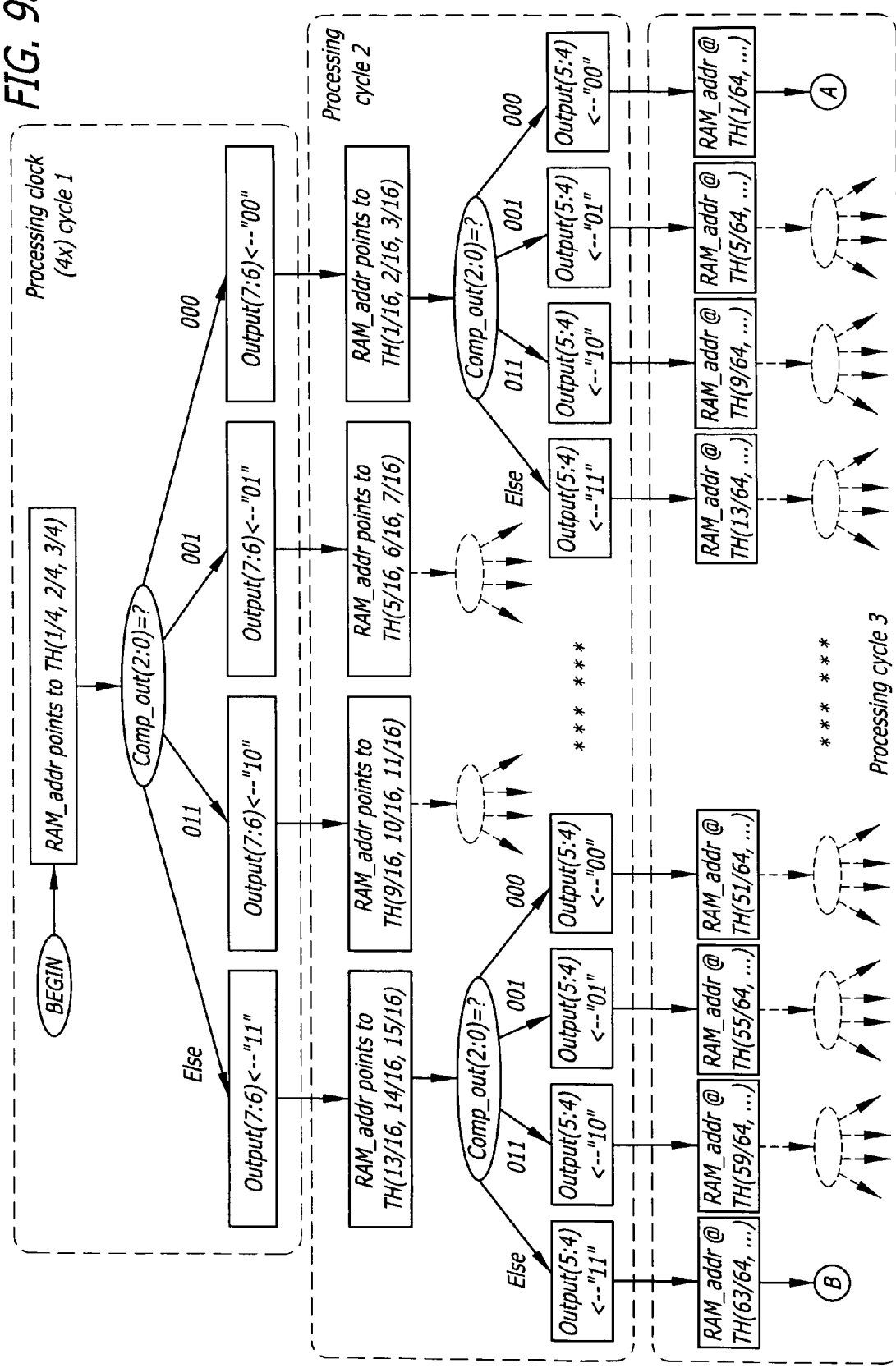
FIG. 9 is a flow diagram illustrative of the operation of the present invention as implemented in software running on the controller.
Figure 9B:
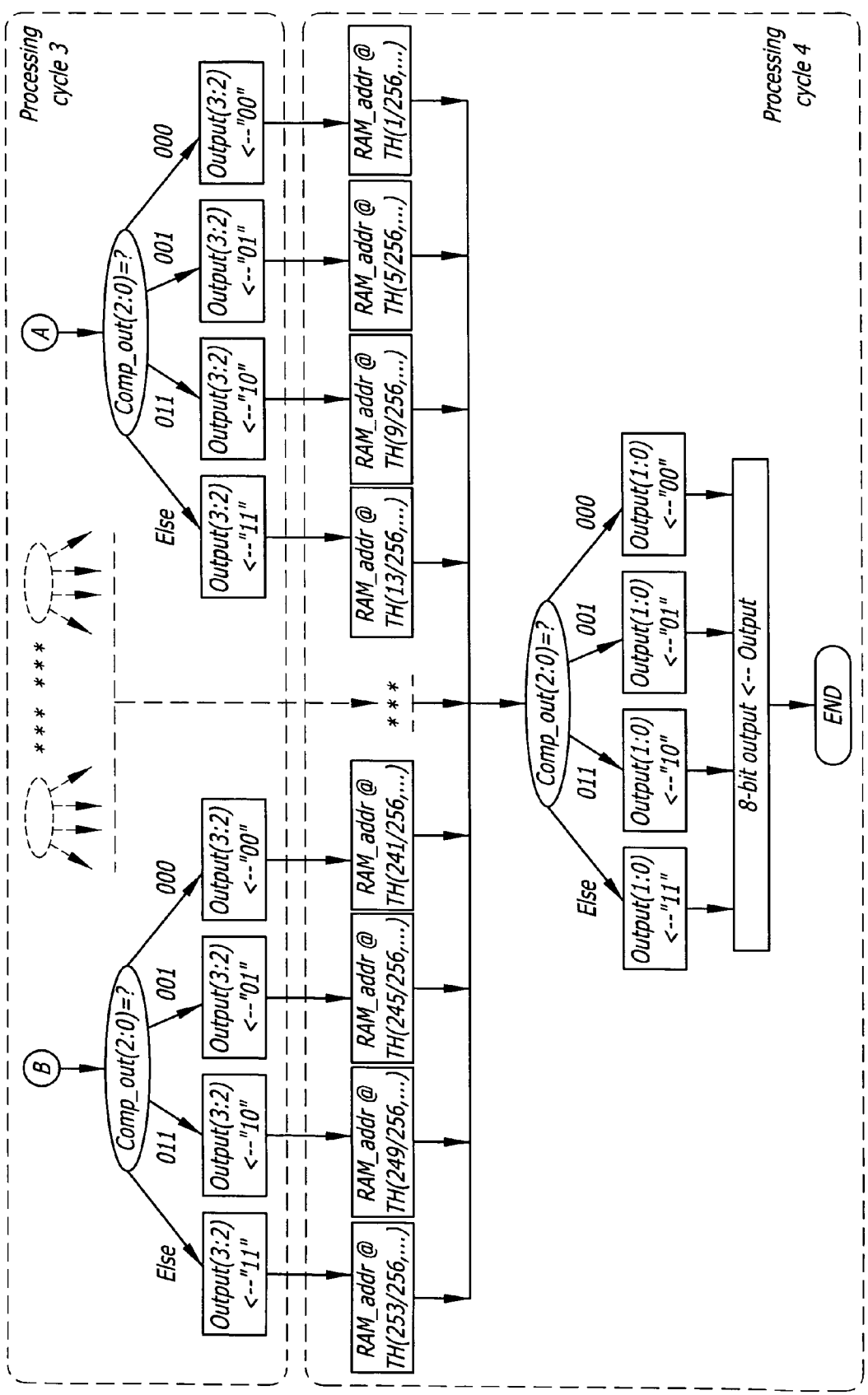

FIG. 9 is a flow diagram illustrative of the operation of the invention of FIG. 7*a* as implemented in software running on the controller 102. In FIG. 9(*a*) processing for clock cycles 1 and 2 are illustrated. In FIG. 9(*b*), processing for clock cycles 3 and 4 are depicted.

The number of comparators can be increased to lower the processing clock cycles needed to complete the task, however, would need more hardware. The comparators can compare "less than or equal to" as shown in FIG. 7*a*. The comparators can also be implemented as "greater than" as shown in FIG. 8. Threshold memory data arrangements in each comparison stage must match the type of comparator used.

FIG. 10*a* is a simplified diagram showing an arrangement for a lookup table in accordance with conventional teachings. In accordance, with conventional teachings, AGC is typically achieved by mapping N bit input video to 8 bit display dynamic range. Conventional methods include:

a. Large external memory approach:

For a 12 bit input video compressed into 8 bit output range, the LUT would take up (2\*\*12×8)=32768 bits. For a 14 bit to 8 bit LUT, size of memory is 4 times as big. For high speed video systems, interface to external memory becomes a bottleneck, not to mention the effort to update the LUT. However, this method would match any complex transfer function curve.

b. Piecewise Linear approximation approach:

This method uses several coarse break points over the input video range and linear interpolation between break points to map the input video to output domain. The adjustment resolution on the shape of the input to output transfer curve relies on the number of breakpoints used. Thus, the method cannot generally handle highly non-linear transfer curves resulting from complex algorithms. However, the implementation can be contained in a FPGA without large external memory.

These methods use input video as address inputs to the LUT and the data content of the LUT contains the display video information.

FIG. 10b is a simplified diagram showing an arrangement for compressing input video in accordance with an illustrative embodiment of the present teachings. As discussed above, in accordance with the inventive reverse LUT method:

a. The output resolution is based on the maximum number of output break points used to provide a best possible transfer curve fit (equivalent to large external RAM method) without any compromise on resolution.

b. The content of the LUT contains the break point information of the input video. The address of the LUT contains the output info. This LUT address/content arrangement is the opposite of the conventional method and drastically reduces circuit size and effort to update the LUT. That is, an LUT implemented in accordance with the present teachings should be able to fit inside a field programmable gate array (FPGA) without using external memory.

c. Search and compare algorithms are used to locate the AGC output d. As the number of input video bits grows, size of this reverse LUT grows only by a fraction instead of an exponential increase.

Those skilled in the art will appreciate that the present invention provides a compact solution to drastically reduce the number of RAM bits required for LUT implementation through a reverse approach. In accordance with the present teachings, a highly complex LUT may be implemented inside a field programmable gate array (FPGA) without external memory. This allows for a low cost, low power implementation, with minimal board real estate and effort to update the LUT.

The reverse LUT method uses much less hardware than conventional implementation, and thus, makes it possible to implement the LUT inside FPGAs or ASICs rather than having to carry large off-chip memories. The LUT update time and effort are also drastically reduced from the conventional implementation and hence, relaxes the requirements of the LUT update mechanism. The present invention is particularly attractive for applications involving multiple transfer functions such as color transformation and mapping. The present invention not only saves cost and power, but also, it is extremely important for miniature UAV and miniature robotic and similar applications, where size does matter.

The invention should work for all types of input to output transfer functions, including linear, piecewise linear and non-linear, as long as the input-output relationship is cumulative, independent of the complexity of the transfer function. This method provides an effective way to implement transfer functions derived by external algorithms. The reverse LUT method should require substantially less hardware and less power than the conventional method while maintaining the same level of resolution as the original transfer function—a feature that cannot be matched by other approximation methods.

The present invention should provide a simple, compact and economical solution to implement a cumulative transfer function, independents of complexity, without loss of resolution. The application of the present invention ranges from a simple math look up table in some fast computing systems to video compression applications in imaging systems, UAVs, robotics, . . . etc.

Thus, the present invention has been described herein with reference to a particular embodiment for a particular application. Those having ordinary skill in the art and access to the present teachings will recognize additional modifications, applications and embodiments within the scope thereof. For example, different search algorithms can be applied to the reverse LUT. The number of address pointers can be increased to speed up the result finding process. Some designers may prefer to use only one set of address pointers and a higher clock rate (higher than the video pixel rate) to shrink hardware size. For high-speed video applications, it may be preferable to distribute the reverse LUT into smaller pieces to implement a pipeline design. The present invention is suitable for different algorithms and implementation methods.

It is therefore intended by the appended claims to cover any and all such applications, modifications and embodiments within the scope of the present invention.

Accordingly,

What is claimed is:

1. A data translation system comprising:
first means for storing breakpoints of a desired data compression input to output transfer function in a reverse look up table (LUT) as a first set of thresholds, one breakpoint being stored for each output of the desired data compression input to output transfer function, each output is a compressed version of the input signal and is represented by an address of said reverse LUT, and each breakpoint being stored as data of said reverse LUT; and
second means for comparing an input signal to said breakpoints of said first set of thresholds to obtain a breakpoint, searching said reverse LUT for an address of said reverse LUT corresponding to the breakpoint obtained, and providing a first output represented by the address found, said first output indicative of a first range of said input signal.

2. The system of claim 1 further comprising third means responsive to said first output for selecting a second set of thresholds.

3. The system of claim 2 wherein said second set of thresholds is stored in means for storing a plurality of values of said transfer function in a subrange within said first range.

4. The system of claim 2 wherein said third means is a first address controller coupled to the output of said second means.

5. The system of claim 2 further comprising fourth means for comparing said input signal to said second set of thresholds and providing a second output in response thereto indicative of a second range of said input signal.

6. The system of claim 5 further comprising fifth means responsive to said second output for selecting a third set of thresholds.

7. The system of claim 6 wherein said third set of thresholds is stored in means for storing a plurality of values of said transfer function in a subrange within said second range.

8. The system of claim 6 wherein said fifth means is a second address controller coupled to the output of said fourth means.

9. The system of claim 6 further comprising sixth means for comparing said input signal to said third set of thresholds and providing a third output in response thereto indicative of a third range of said input signal.

10. The system of claim 9 further comprising seventh means responsive to said third output for selecting a fourth set of thresholds.

11. The system of claim 10 wherein said fourth set of thresholds is stored in means for storing a plurality of values of said transfer function in a subrange within said third range.

12. The system of claim 10 wherein said seventh means is a third address controller coupled to the output of said sixth means.

13. The system of claim 10 further comprising eighth means for comparing said input signal to said fourth set of thresholds and providing a fourth output in response thereto indicative of a fourth range of said input signal.

14. The system of claim 13 further comprising ninth means for combining said outputs to provide a compressed output signal in response to said input signal in accordance with said data compression input to output transfer function.

15. A data translation system comprising:
a first memory for storing breakpoints of a desired data compression input to output transfer function in a reverse look up table (LUT) as a first set of thresholds, one breakpoint stored for each output of the desired data compression input to output transfer function, each output is a compressed version of the input signal and is represented by an address of said reverse LUT, and each breakpoint being stored as data of said reverse LUT;
a first comparator for comparing an input signal to said breakpoints of said first set of thresholds to obtain a breakpoint, searching said reverse LUT for an address of said reverse LUT corresponding to the breakpoint obtained, and providing a first output represented by the address found, said first output indicative of a first range of said input signal;
a second memory for storing a plurality of values of said transfer function in a subrange within said first range;
a first address controller responsive to said first output, for selecting a second set of thresholds stored in said second memory;
a second comparator for comparing said input signal to said second set of thresholds and providing a second output in response thereto indicative of a second range of said input signal;
a third memory for storing a plurality of values of said transfer function in a subrange within said second range;
a second address controller responsive to said second output for selecting a third set of thresholds from said third memory;
a third comparator for comparing said input signal to said third set of thresholds and providing a third output in response thereto indicative of a third range of said input signal;
a fourth memory for storing a plurality of values of said transfer function in a subrange within said third range;
a third address controller responsive to said third output for selecting a fourth set of thresholds from said fourth memory;
a fourth comparator for comparing said input signal to said fourth set of thresholds and providing a fourth output in response thereto indicative of a fourth range of said input signal; and
logic for combining said outputs to provide a compressed output signal in response to said input signal in accordance with said data compression transfer function.

16. A data translation method comprising:
storing breakpoints of a desired data compression input to output transfer function in a reverse look up table (LUT) as a first set of thresholds, one breakpoint being stored for each output of the desired data compression input to output transfer function, each output is a compressed version of the input signal and is represented by an address of said reverse LUT, and each breakpoint being stored as data of said reverse LUT; and
comparing an input signal to said breakpoints of said first set of thresholds to obtain a breakpoint, searching said reverse LUT for an address of said reverse LUT corresponding to the breakpoint obtained, and providing a first output represented by the address found, said first output indicative of a first range of said input signal.

17. The invention of claim 16 further comprising storing a plurality of values of said transfer function in a subrange within said first range as a second set of thresholds.

18. The invention of claim 17 further comprising selecting a subset of said second set of thresholds in response to said first output.

19. The invention of claim 18 further comprising comparing said input signal to said subset of second set of thresholds and providing a second output in response thereto indicative of a second range of said input signal.

20. The invention of claim 19 further comprising combining said outputs to provide a compressed output signal in response to said input signal in accordance with said data compression input to output transfer function.

21. The data translation system of claim 1, wherein said desired data compression input to output transfer function is a video data compression input to output transfer function.

22. The data translation system of claim 1, wherein said desired data compression input to output transfer function is a non-linear data compression input to output transfer function.

23. A data translation system, comprising:
a first pipeline register that receives an input data signal and outputs a pipelined version of the input data signal;
a first comparison stage comprising a first set of threshold memories operatively coupled to a first comparator and a first address controller, said first comparator being arranged to compare the input data signal with a first plurality of breakpoint thresholds stored in the first set of threshold memories, one breakpoint stored for each output of a desired data translation input-output transfer function, said first plurality of breakpoint thresholds representing a first section of the desired data translation input-output transfer function applied to the input data signal, said first comparator determining a quadrant of the input data signal and providing an output with respect thereto to the first address controller;
a second comparison stage comprising a second set of threshold memories operatively coupled to a second comparator and a second address controller, said second comparator being arranged to compare the pipelined version of the input data signal with a second plurality of breakpoint thresholds stored in the second set of threshold memories and selected by an output of the first address controller, said second plurality of breakpoint thresholds representing a second section of the desired data translation input-output transfer function for the input data signal; and
a result generator operatively coupled to time-aligned outputs of the first and second comparison stages, said result generator being arranged to output a compressed version of the input data signal in accordance with the desired data translation input-output transfer function, wherein the result generator comprises a reverse lookup table (LUT) in which each address of the reverse LUT represents a compressed version of the input signal and breakpoints are stored as data of the reverse LUT, wherein the result generator is configured to carry out a reverse lookup table process outputting the compressed version of the input data signal that is derived from an address in the lookup table corresponding to one or more breakpoint thresholds of the desired data translation input-output transfer function.

* * * * *